United States Patent [19]
Arisaka et al.

[11] Patent Number: 5,499,924
[45] Date of Patent: Mar. 19, 1996

[54] BUTT JOINT CONNECTOR ASSEMBLY

[75] Inventors: Hiroshi Arisaka; Kenji Kawawada, both of Tama; Kiyoshi Omata, Tokyo, all of Japan

[73] Assignee: Kel Comporation, Tokyo, Japan

[21] Appl. No.: 273,057

[22] Filed: Jul. 11, 1994

[30] Foreign Application Priority Data

| Jul. 12, 1993 | [JP] | Japan | 5-043134 U |
| Jul. 12, 1993 | [JP] | Japan | 5-195153 |
| Jul. 12, 1993 | [JP] | Japan | 5-195154 |

[51] Int. Cl.$^6$ ............................... H01R 23/66
[52] U.S. Cl. ............................... 439/67; 439/74
[58] Field of Search ............... 439/67, 77, 492, 439/493, 74

[56] References Cited

U.S. PATENT DOCUMENTS

| 3,526,867 | 9/1970 | Keeler, II | 439/74 |
| 4,775,917 | 10/1988 | Eichkorn | 361/388 |
| 4,861,272 | 8/1989 | Clark | 439/79 |
| 4,892,487 | 1/1990 | Dranchak | 439/260 |
| 4,911,643 | 3/1990 | Perry | 439/67 |
| 4,976,626 | 12/1990 | Dibble et al. | 439/67 |
| 5,118,299 | 6/1992 | Burns et al. | 439/74 |
| 5,316,486 | 5/1994 | Tanaka | 439/62 |
| 5,342,207 | 8/1994 | Sobhani | 439/74 |

FOREIGN PATENT DOCUMENTS 4-368790  12/1992  Japan.

*Primary Examiner*—Gary F. Paumen
*Attorney, Agent, or Firm*—Robert W. J. Usher

[57] ABSTRACT

Connector members have respective film circuits with contact bumps of male and female sets or other complementary configurations and are brought into electrical connection by butting engagement. An elastomer underlies the bumps and is compressed by the engagement to provide contact pressure. The contact bumps of each female set are three or four in number arranged to form a triangular or square ring for engagement with a single male bump to provide a self-centering action. The male contact bump can be elongate so as to bridge completely across the ring. In other examples, both complementary contact bumps are elongate and extend in transverse directions on respective film circuits so that they are brought into transverse engagement, accommodating slight misalignment. Alternatively, instead of a bump configuration, a female member is formed by an aperture in a insulating layer of one film circuit overlying a conductive path and receiving a contact bump of the other film circuit.

11 Claims, 14 Drawing Sheets

5,499,924

BUTT JOINT CONNECTOR ASSEMBLY

FIELD OF THE INVENTION

The invention relates to a butt joint connector assembly in which respective conductive paths of film circuit contact members are electrically connected together.

BACKGROUND OF THE INVENTION

A prior connector assembly employing film circuits as contact members (flexible cable contacts) constituted by forming a plurality of conductive paths or patterns on insulating film is disclosed, for example, in Japanese Patent No. 4-368790, published Dec. 21, 1992 and U.S. Pat. No. 5,316,486 issued to Tanaka et al. on May 31, 1994.

In a receptacle or female housing of the prior connector assembly, the film circuit contact member is maintained folded into a U or channel section with the channel mouth opening to the mating face and in a male connector housing to be inserted in the channel, the respective conductive paths of a film circuit extend along the sides of a plug housing so that contact portions of both film circuit contact members extend parallel to the insertion or mating direction.

The prior approach is disadvantageous as during both insertion and removal of the plug connector the conductive paths of the two film circuit contact members slide across each other which action may abrade the conductive paths. Furthermore, as the pitch of the conductive paths is often small, and a high degree of precision is required in accurately aligning the male and female connectors during mating to connect respective conductive paths reliably and to avoid cross connection. Thus, an accurate connector positioning guide is necessary, which requirement tends to increase the structural complexity and manufacturing cost.

SUMMARY OF THE INVENTION

An object of the invention is to provide a connector assembly employing film circuit contact members but which virtually eliminates the risk of abrasion of the contact parts, and where the structure of the connector positioning guide can be relatively simple.

According to one aspect of the invention, this is achieved by providing a butt joint connector in which the mating contact portions of respective film circuit contact members extend perpendicularly of the mating direction or axis and are brought into mating engagement while aligned in face to face relation. The contact portions of respective film circuit contact members may comprise a plurality of contact bumps arranged in closely spaced apart relation forming a female configuration and a single male bump which is pressed between and in engagement with adjacent portions of the bumps of the female configuration to provide the electrical connection.

As the respective contact portions of the Film Circuit Contact Members are pressed into engagement while aligned, face-to-face, risk of abrasion which would arise from sliding contact is obviated, while the receipt of the male bump between a plurality of bumps provides a self centering action compensating for any slight misalignment and manufacturing tolerances.

More specifically, the invention provides a butt joint connector assembly having, male and female connector members comprising: male and female film circuit contact members, respectively, each comprising an insulating film having a series of lead forming conductive paths extending thereacross from a contact portion; each contact portion comprising a series of contact bumps of conductive material upstanding from a mating face of the film and connected to the conductive paths, the series of contact bumps of the female film circuit contact member being arranged in sets of pluralities of bumps with the contact bumps of each set being located in closely spaced apart relation to form a female contact bump configuration connected to a respective conductive path and the series of contact bumps of the male film circuit contact member being arranged as single bumps located at a pitch corresponding to a pitch of the sets of contact bumps forming the female configuration and each forming a male contact bump configuration; first and second film circuit contact member supporting housings, respectively, having respective mating faces; means supporting the respective film circuits on respective housings with the respective contact portions extending across respective mating faces substantially perpendicular to a mating direction and with the respective contact bumps outstanding therefrom in the mating direction; and connector guiding means for guiding the connector members into mating engagement with mating contact portions of respective film circuit contact members extending in face-to-face relation so that contact bumps of the male configuration become interposed between and in contact with adjacent portions of respective contact bumps of the respective sets of contact bumps of the female configuration to effect reliable electrical connection between respective conductive paths of the complementary connectors.

According to another aspect, the invention provides a butt joint connector assembly having first and second, complementary engageable connector members comprising: first and second, complementary, film circuit contact members, respectively, each comprising an insulating film having a series of lead forming conductive paths extending thereacross from a contact portion; each contact portion comprising a series of elongate contact bumps of conductive material upstanding from a contact face of the film and connected to respective conductive paths, the contact bumps of the first and second film circuit contact members being arranged at a common pitch and the contact bumps of the first film circuit contact member extending transversely of the respective contact bumps of the second film circuit contact member; first and second film circuit contact member supporting housings having respective contact faces; means supporting the respective film circuits on respective housings with the respective contact portions extending across respective contact faces and the respective contact bumps outstanding therefrom; and connector guiding means for guiding the connector members into mating engagement with contact portions of respective film circuit contact members extending in face to face relation so that complementary contact bumps of respective connector members are brought into transverse engagement to effect reliable electrical connection between respective conductive paths of the complementary connectors.

As the respective complementary contact bumps are elongate and extend in transverse directions, a significant degree of misalignment can be accommodated while obtaining a reliable electrical connection.

According to another aspect of the invention, there is provided a butt joint connector assembly having male and female connector members comprising: male and female film circuit contact members, respectively, each comprising an insulating film having a series of lead forming conductive paths extending across a surface thereof from respective contact portions; the first contact portion comprising a series of male contact bumps of conductive material upstanding from a contact face of the insulating film and connected to respective conductive paths, the second contact portion comprising a series of apertures in the insulating film aligned with respective conductive paths and at the same pitch as the contact bumps to form contact bump receiving recesses of a female configuration opening to a contact face of the insulating film remote from the respective conductive paths; first and second film circuit contact member supporting housings having respective contact faces; means supporting the respective film circuit contact members on respective housings with the first and second contact portions extending across respective contact faces and the contact bumps outstanding from the contact face of the first housing and the respective contact bump receiving recesses opening outwardly of the contact face of the second housing in a mating direction; and connector guiding means on respective housings for guiding the connector members into mating engagement with mating contact portions of respective film circuit contact members extending in face-to-face relation so that the male contact bumps are received in respective recesses and engage respective conductive paths thereby effecting reliable electrical connection between respective conductive paths of the complementary connectors.

BRIEF DESCRIPTION OF THE DRAWINGS

Embodiments of the present invention are described below, by way of example only, and with reference to the accompanying drawings in which.

DESCRIPTION OF PARTICULAR EMBODIMENTS

Figure 1:
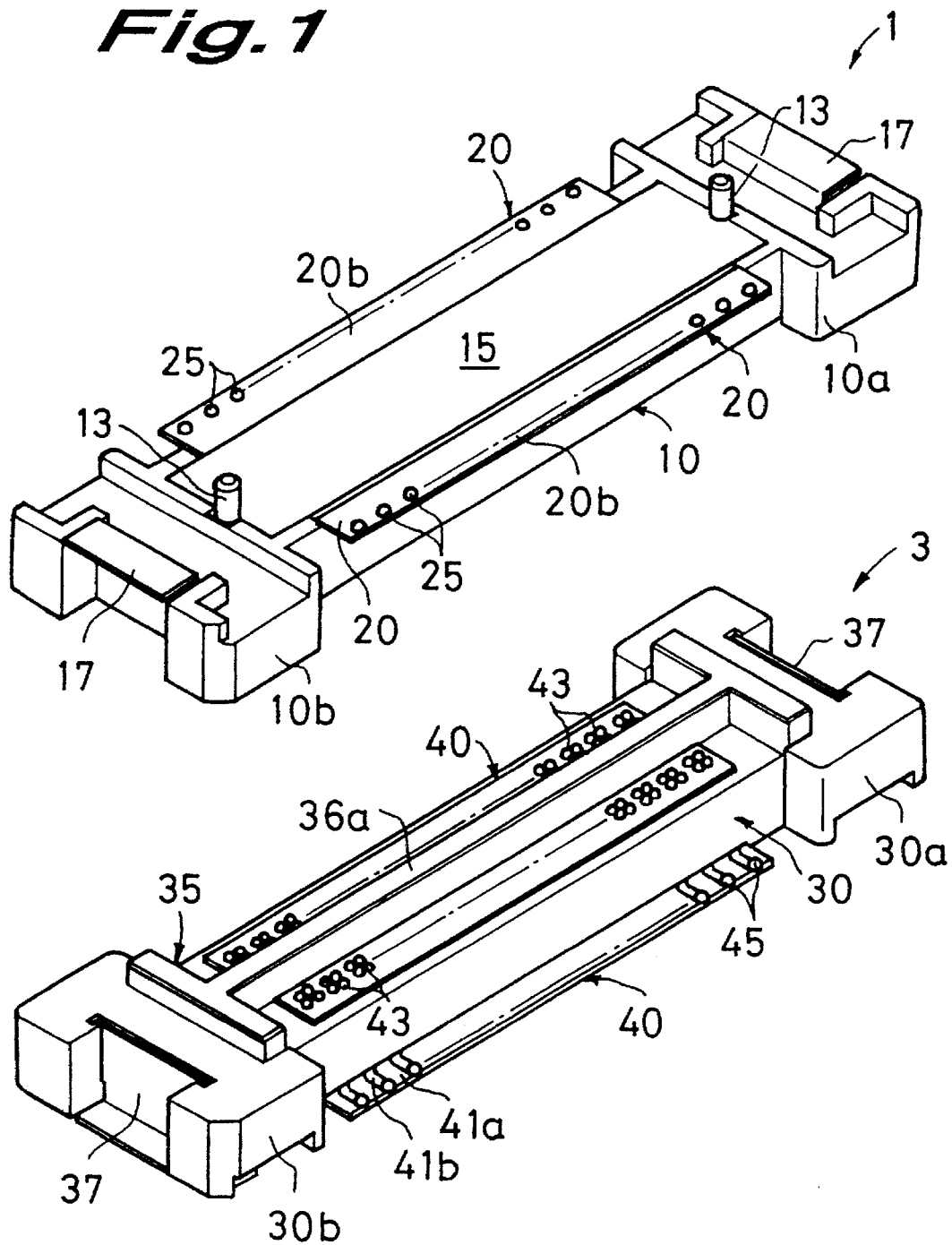
FIG. 1 is a perspective view showing complementary connector members of a butt joint connector assembly according to a first embodiment of the invention aligned for mating engagement.
Figure 2:
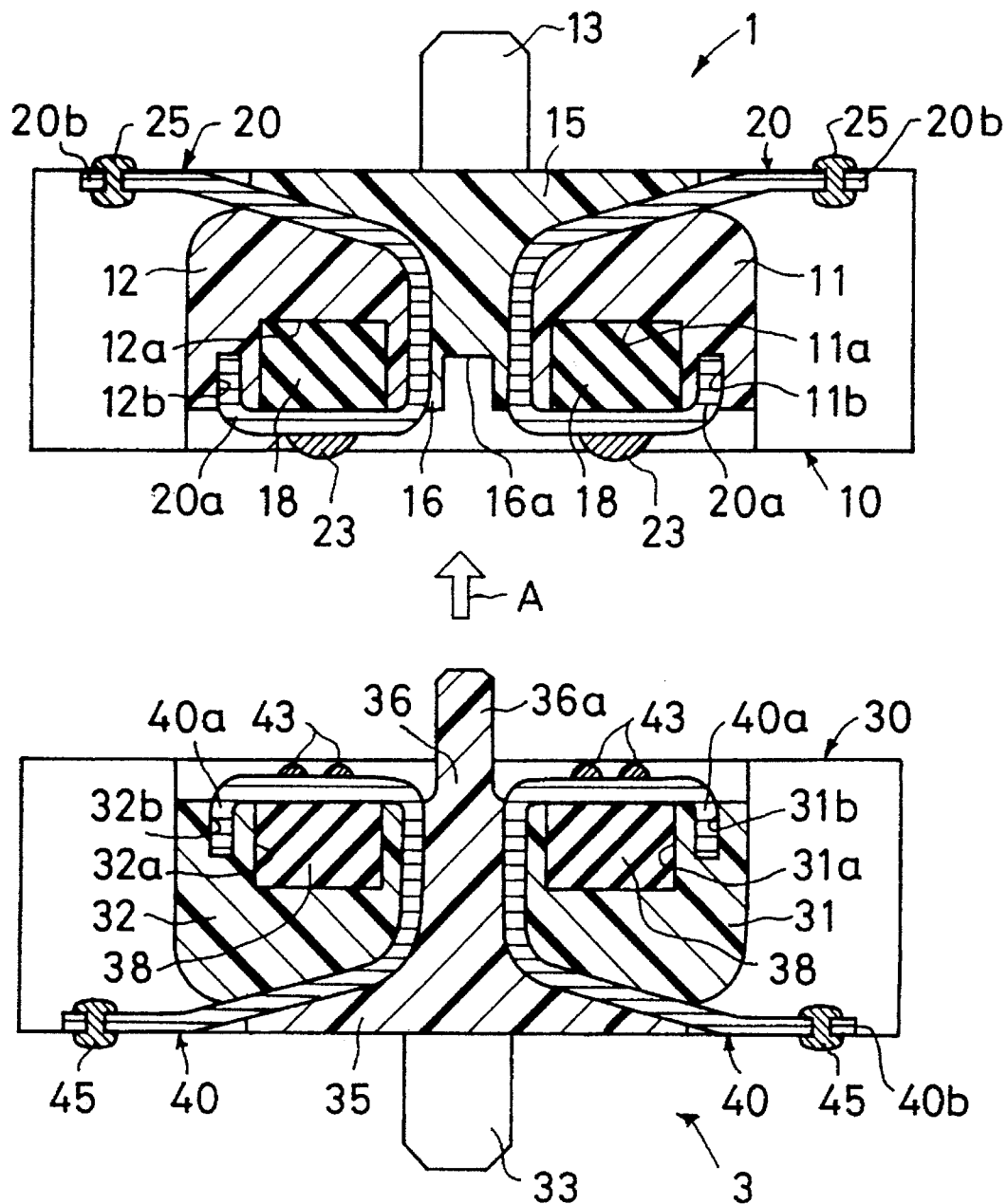
FIG. 2 is a cross-sectional view taken along line II—II of FIG. 1.
Figure 3:
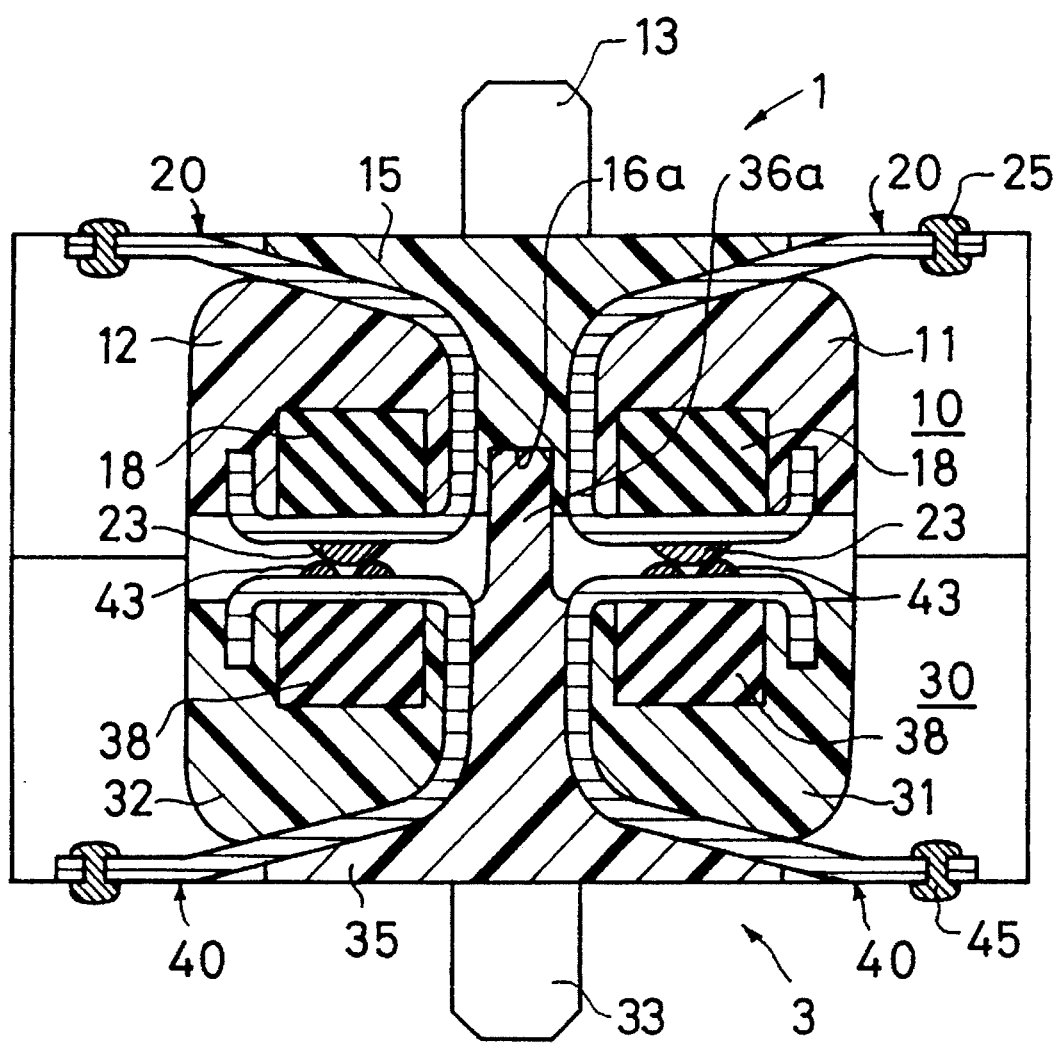
FIG. 3 is a similar view to FIG. 2 but with the connector assemblies in mating engagement.

As shown in FIGS. 1–3, a first embodiment of butt joint connector assembly comprises a male connector member 1 and a female connector member 3.

The male connector 1 comprises a generally rectangular housing frame 10 molded in one piece of rigid insulating plastic with a pair of film circuit contact member holding arms 11 and 12 extending at a predetermined spacing apart from each other, in parallel relation, between opposed transverse end portions 10a and 10b; a pair of male film circuit contact member members 20, wound around respective holding arms 11 and 12, and a retaining member 15 which clamps the male film circuit contact member members 20 against the holding arms 11 and 12, respectively.

Rectangular section grooves 11a and 12a are formed in a mating face of holding arms 11 and 12, respectively, to extend longitudinally thereof and elongate rubber biassing members 18 are mounted in respective grooves. Film circuit contact member member anchoring grooves 11b and 12b are also formed in the mating face of respective holding arms 11 and 12 at locations between the grooves 11a and 11b and the outer, longitudinal peripheries of the respective holding arms.

The male film circuit contact member members 20 are assembled with the housing by anchoring edge portions 20a thereof in respective anchoring grooves 11b and 12b (for example, with adhesive), and then winding the film circuit contact member members around respective holding arms 11 and 12 so that the contact portions extend across the mating face, over respective biassing members, between the arms and with trailing board connecting end portions diverging at a printed circuit board engaging face opposite the mating face. A tip of the retaining member 15 is then inserted between the holding arms from the board engaging face, clamping the two film circuit contact member members 20 against inner adjacent sides respective holding arms.

In this state, the retaining member 15 is engaged by the male housing 10 and an engagement means (not shown) retaining it in clamping engagement with the film circuit contact member members.

A guiding groove 16a which is formed at the tip 16 of the retaining member 15 then opens in the mating direction, between the two holding arms 11 and 12.

Board mounting bosses 13 outstand from respective housing end portions 10a and 10b and board mounting fixtures 17, each consisting of an L-shaped metal plate, are attached to end faces of respective housing end portions 10a and 10b.

The male connector member is securely mounted on a pcb by inserting the mounting bosses 13 into mounting holes formed in the pcb and soldering the feet of the mounting plates to solder pads on the board by a conventional reflow soldering technique.

The male film circuit contact member members 20 comprise a series of conductive paths formed on an insulating film such as polyamide resin. A single male contact bump 23 is formed on each conductive path at a contact portion of the film circuit contact member which is adjacent the edge portion 20a, and a single soldering bump 25 is formed on the other end of the conductive path at the trailing board connecting end 20b so that, when mounted in the housing, the male contact bumps 23 are positioned, aligned at the prescribed pitch on the biassing members 18 and protrude from the mating face beyond the plane of the housing, while the soldering bumps 25 protrude slightly from the board engaging face of the male housing 10.

The female connector member 3 is similar to the male connector member 1, comprising a generally rectangular housing frame 30 molded in one piece of rigid insulating plastic with a pair of film circuit contact member holding arms 31 and 32 extending at a predetermined spacing apart from each other, in parallel relation, between opposed transverse end portions 30a and 30b; a pair of female film circuit contact member members 40, wound around respective holding arms 31 and 32, and a retaining member 35 which clamps the female film circuit contact member members 40 against the holding arms 31 and 32, respectively.

Rectangular section grooves 31a and 32a are formed in a mating face of holding arms 31 and 32, respectively, to extend longitudinally thereof and elongate rubber biassing members 38 are mounted in respective grooves. Film circuit contact member anchoring grooves 31b and 32b are also formed in the mating face of respective holding arms 31 and 32 at locations between the grooves 31a and 31b and the outer, longitudinal peripheries of the respective holding arms.

Rectangular section grooves 31a and 32a are formed in a mating face of holding arms 31 and 32, respectively, to extend longitudinally thereof and elongate rubber biassing members 38 are mounted in respective grooves. Film circuit contact member anchoring grooves 31b and 32b are also formed in the mating face of respective holding arms 31 and 32 at locations between the grooves 31a and 31b and the outer, longitudinal peripheries of the respective holding arms.

Assembly of the female film circuit contact member members with the housing is similar to that of the male film circuit contact member. Edge portions 40a of the female film circuit contact member members 40 are anchored in respective anchoring grooves 31b and 32b, and then wound around respective holding arms 31 and 32 so that the contact portions extend across the mating face, over respective biassing members, between the arms and with trailing board connecting end portions diverging from a printed circuit board engaging face opposite the mating face. A tip of the retaining member 35 is then inserted between the holding arms from the board engaging face, clamping the two film circuit contact member members 40 against inner adjacent sides of respective holding arms.

A guiding rib 36a of complementary shape to the groove 16a formed at the tip 36 of the retaining member 35 then protrudes in the mating direction beyond the mating face, between the two holding arms 31 and 32.

As with the male film circuit contact member members, board mounting bosses 33 outstand from respective housing end portions 30a and 30b and board mounting fixtures 37, each consisting of an L-shaped metal plate, are attached to end faces of respective housing end portions 30a and 30b, for mounting on a pcb in a similar manner to the male connector member.

Each female film circuit contact member 40 is of generally similar construction to the male film circuit contact member member 20 but, instead of a single male bump, a set of four, smaller, contact bumps 43 grouped as a square ring forming a female configuration are formed on each conductive path at equal intervals at a contact portion of the film circuit contact member member which is adjacent the edge portion 40a, and a single soldering bump 45 is formed on the other end of a respective conductive path at the trailing board connecting end 40b so that, when mounted in the housing, the female contact bumps 43 are positioned and aligned at the prescribed pitch on the biassing members 38 in coplanar relation with the mating face of the housing, while the soldering bumps 45 protrude slightly from the board engaging face of the female housing 30.

Figure 5:
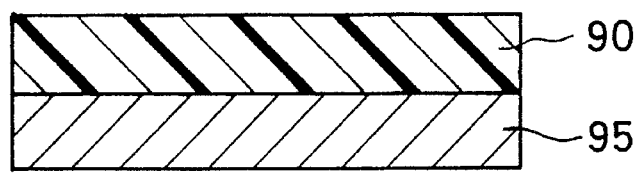
FIGS. 5(A)–5(D) are schematic cross-sectional views showing successive stages in the manufacturing process of the film circuit contact member shown in FIG. 4.
Figure 5:
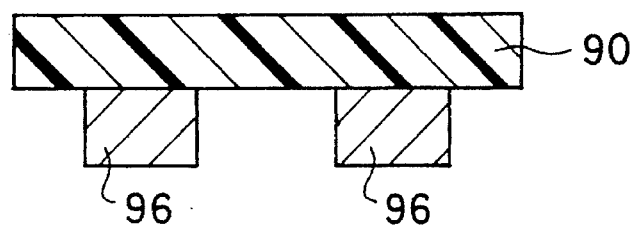
Figure 5:
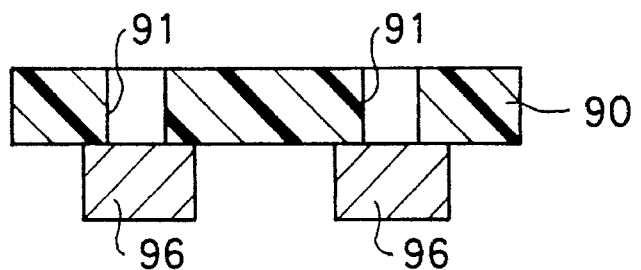
Figure 5:
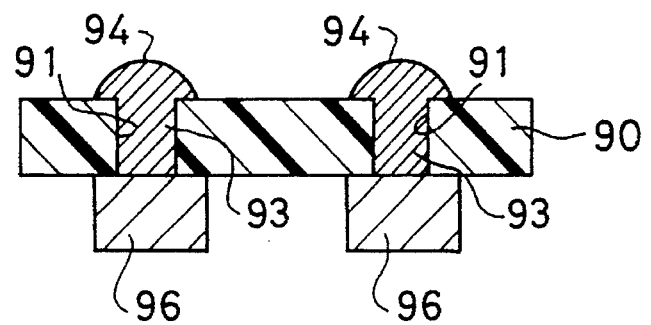

Both the male and female film circuit contact member members 20 and 40, are made, for example, from a substrate called ASMAT, manufactured by Nitto Denko (Inc.). The manufacturing process for the substrate is described with reference to FIG. 5.

As shown in FIG. 5(A), an insulating film layer 90 consisting of polyamide is formed by casting the molten plastic on a copper foil 95. As shown in FIG. 5(B), the copper foil 95 is then etched forming a residual pattern of conductive paths 96 on one surface of the film. As shown in FIG. 5(C), small apertures 91 are then formed through the insulating film layer 90 at predetermined locations which are aligned with respective conductive paths. Thereafter, as shown in FIG. 5(D), the interior of each small aperture 91 is filled with metal which is further built up to form the bumps 94. As a result, each bump 94 protrudes above the other, opposite surface of the insulating film and is connected to the wiring pattern layer 96 via the filling metal 93 which extends through respective apertures.

Figure 4:
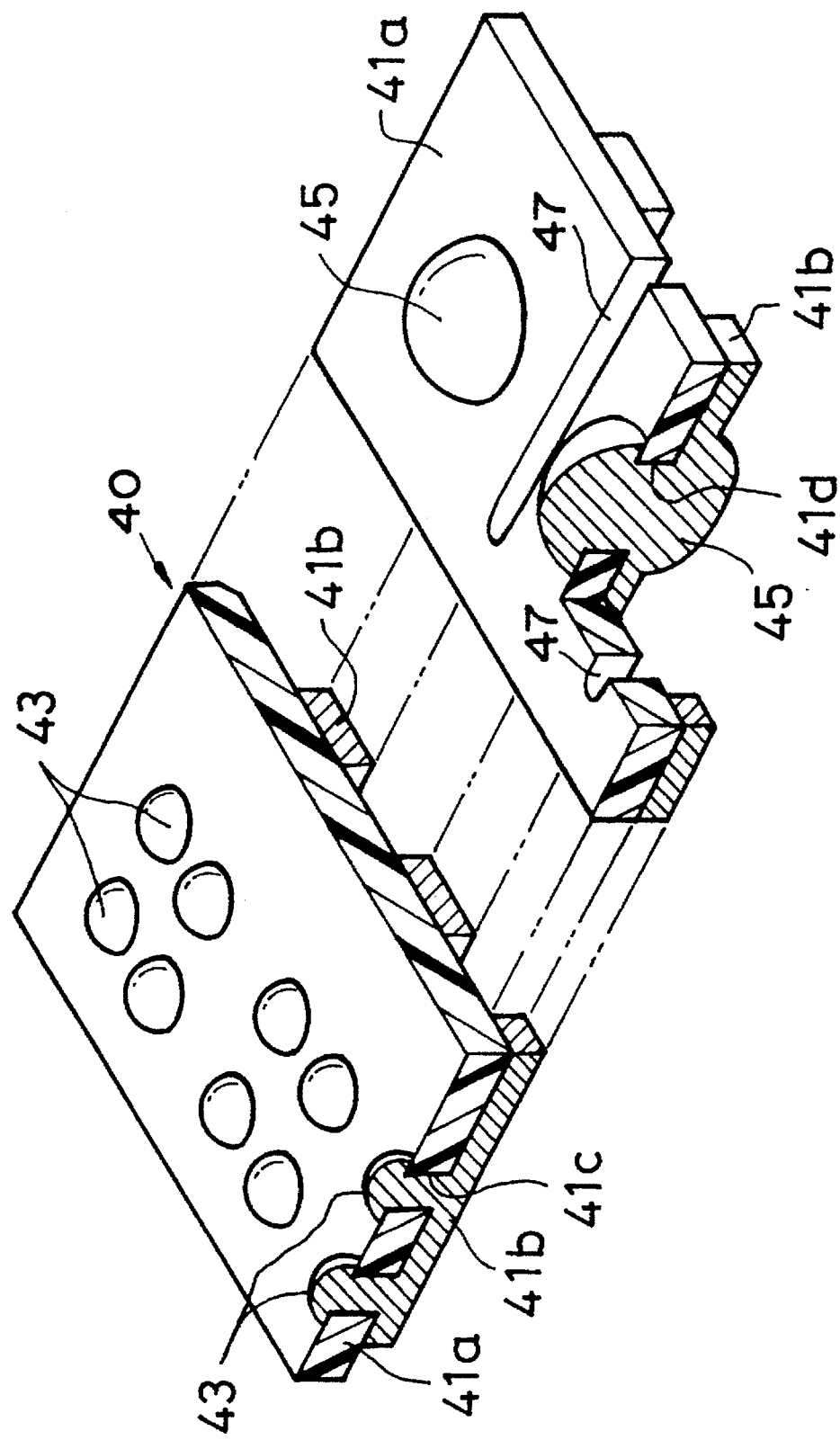
FIG. 4 is a perspective view showing a female type of film circuit contact member of the butt joint connector assembly of FIG. 1.

Thus, in summary, the female film circuit contact member member 40 consists of the insulating film layer 41a and a plurality of conductive paths or wiring pattern layers 41b which are formed on the underside thereof, as shown in FIG. 4. At an edge portion of the insulating film layer 41a, corresponding to the contact portion of the film circuit contact member, groups or rings of four small holes 41c are formed over each respective wiring pattern layer 41b and are filled with metal (Ni, Au, Cu, etc.) which is built up to form four-unit sets of female contact bumps 43 on the opposite face of the film from the conductive paths 41b.

A single aperture 41d is formed by piercing through both each conductive path 41b and the overlying insulating film and is filled with solder which is built up to form a soldering bump 45 extending vertically both above and below the film and conductive path.

Although only a single soldering bump 45 is shown for each conductive path in this example, it will be appreciated that a plurality of such bumps may be provided. In either case, the surface mounting on a pcb is easily accomplished simply by heating the bump with an ultrasonic heater.

In order to obviate a risk of a solder bridge forming between adjacent solder bumps 45 during solder reflow, slits 47 are formed through the insulating film layer 45 between each of the soldering bumps 45. Furthermore, the slits enable flexure of the portions of the film separated by the slits so that even if the soldering bumps 45 are of differing heights, each can be brought into firm contact with a respective conductive path on a pcb obviating risk of imperfect connection.

The only difference between the manufacture of the male and female film circuit contact member 20 is that, in the male film circuit contact member only a single small metal filled aperture is provided on a respective conductive path.

The male and female connector members 10 and 30 are moved into mating engagement or abutment in the direction of arrow A in FIG. 2 so that the guiding or polarizing projection 36a of the female housing 30 is received in the guiding groove 16a of the female housing 10, accurately positioning the members so that the male and female contact bumps 23 and 43, respectively, are brought into contact engagement with resilient compression of the biassing members 18 and 38 providing a predetermined contact force.

Figure 6:
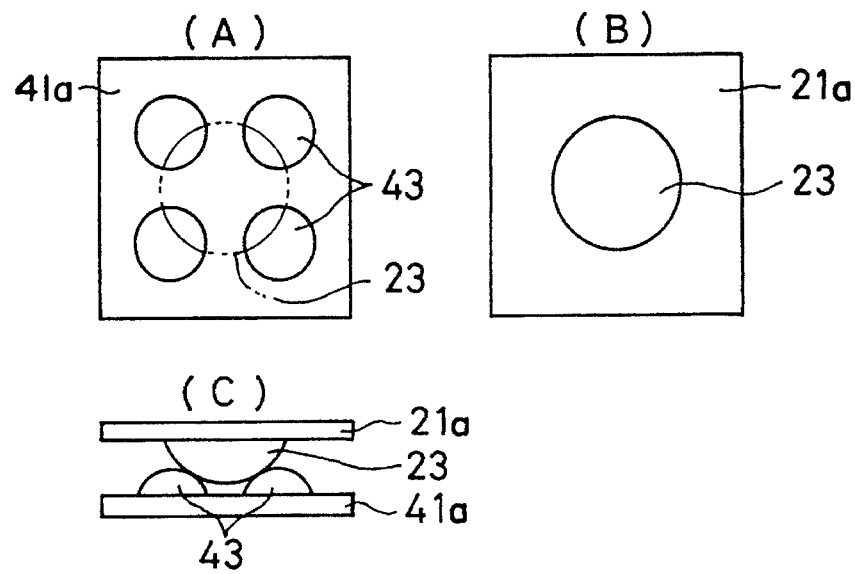
FIG. 6 is a plan view and an elevational view of the male and female contact bumps of male and female types of film circuit contact member in mating engagement.

As shown in FIG. 6(A) and (B), when the male and female connector members 1 and 3 are brought into abutment in the aforementioned manner, the male contact bump 23 is positioned at the center of the four female contact bumps 43, (as shown by the double dotted broken line in FIG. 6(A) and they are brought into contact as shown in FIG. 6(C) so that the male contact bump 23 is surrounded by and interposed between the four female contact bumps 43, and a firm and superior connection is effected between the two types of bumps.

Furthermore, even if the male contact bump 23 is slightly off-center during connecting movement, it is centered by engagement with the female contact bumps 43. As a result of this self-alignment, accurate positioning and reliable connection is obtained automatically, accommodating a margin of error or manufacturing tolerance in the precise positions of the male and female film circuit contact member members 20 and 40 when assembled in their housings, facilitating ease of manufacture.

The male and female connector members can be retained connected together by a pair of U-shape spring clips which clamp over respective end portions 10a and 30a, and 10b and 30b holding them together.

Alternatively, the male and female connector members may be connected by a hinge member providing a hinge lock similar to that used in an integrated circuit socket.

Alternative configurations of the sets of female contact bumps are possible.

Figure 7:
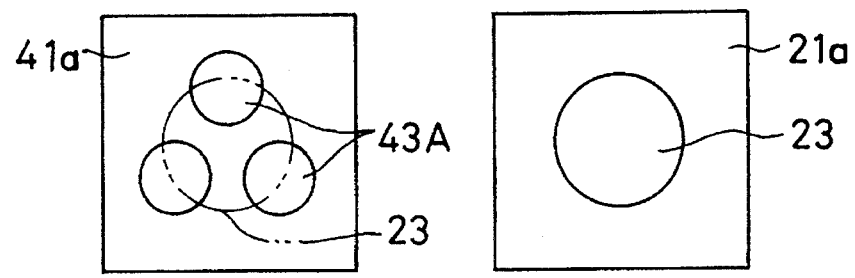
FIG. 7 is a plan view of male and female contact bump configurations according to a second embodiment of the invention.

For example, as shown in FIG. 7, the female contact bumps 43A may be formed from a set of three small bumps arranged at equal intervals as apices of a triangle.

Figure 8:
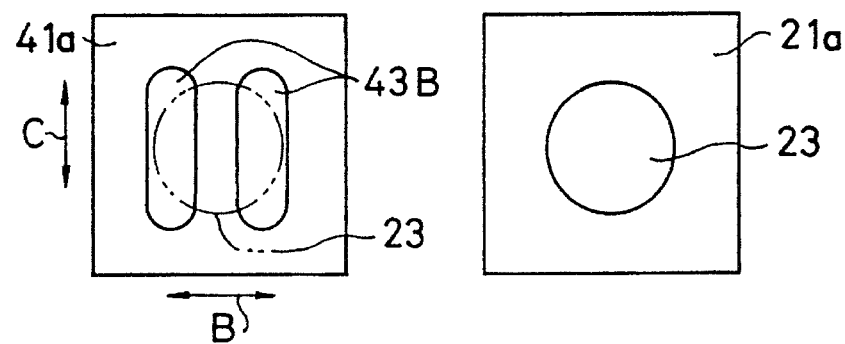
FIG. 8 is a plan view of male and female contact bump configurations according to a third embodiment of the invention.
Figure 9:
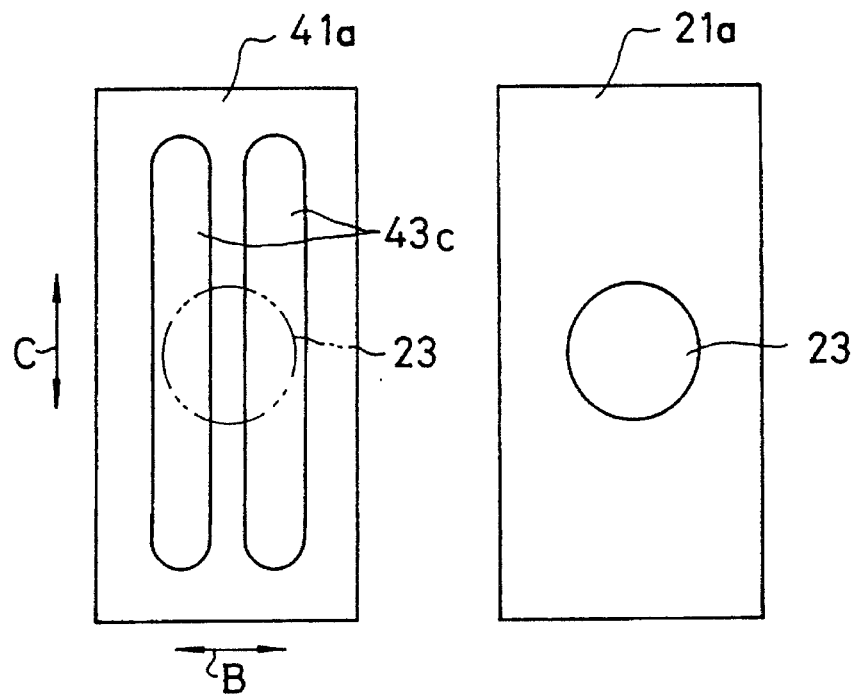
FIG. 9 is a plan view of male and female contact bump configurations according to a fourth embodiment of the invention.

Alternatively, as shown in FIG. 8 and FIG. 9, female contact bumps may formed as a pair of elongate, parallel bumps 43B and 43C. In this configuration, positioning must be accurate in the pitch direction (the direction of arrow B), but effective contact can be obtained with a large tolerance or deviation in position in the perpendicular direction, (the direction of arrow C).

Figure 10:
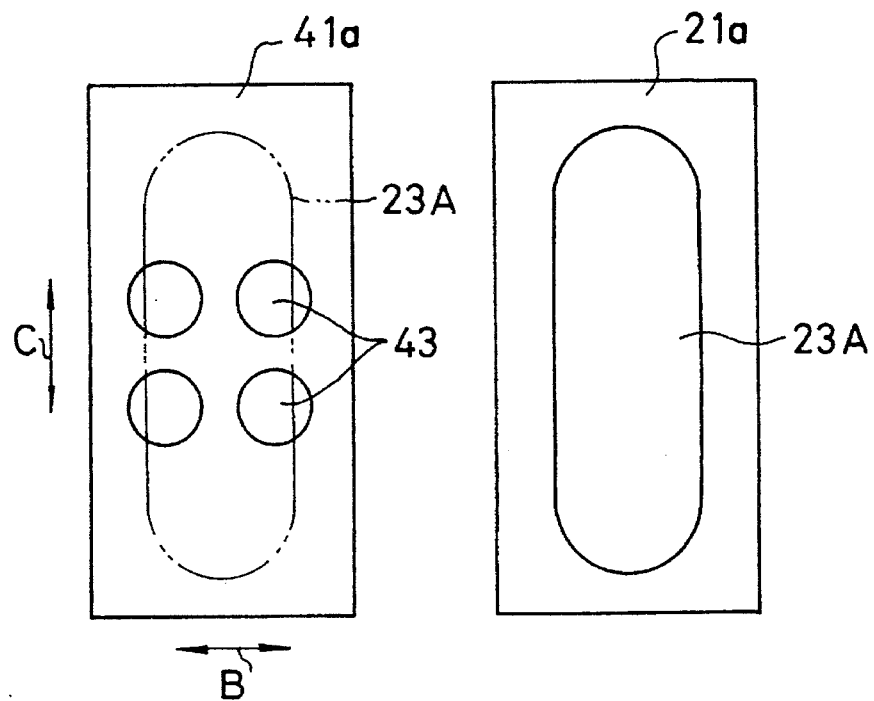
FIG. 10 is a plan view of male and female contact bump configurations according to a fifth embodiment of the invention.

Furthermore, as shown in FIG. 10, it is also acceptable to form the female contact bumps 43 from a set of four small bumps arranged at equal intervals in a square shape, and to configure the male contact bump as a single relatively long and wide bump 23A. In this case, also, positioning in the direction of arrow B must be precise, but relatively large tolerance or deviation in the direction of arrow C can be accommodated.

The connecting movement of the contact bumps 23 and 43 produces a wiping action which affords a reliable electrical connection as described below.

Figure 11:
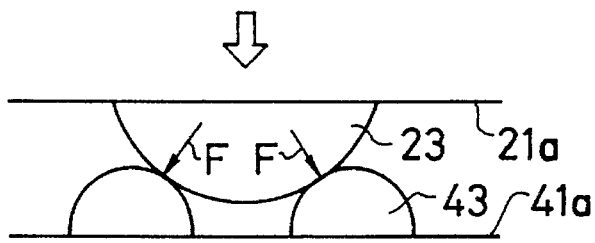
FIGS. 11(A) and 11(B) are diagrammatic views showing the contact forces arising in mating male and female contact bumps and the resolution of those forces into their components, respectively.
Figure 11:
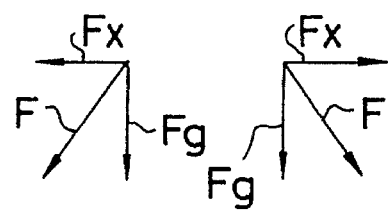

As shown in FIG. 11(A), when the male contact bump 23 is pushed relatively against the female contact bumps 43, the pushing force F exerted on the engaging parts can, as shown in FIG. 11(B), be resolved into the horizontal and vertical components Fx and Fy, respectively. As a result of the horizontal component Fx being in the direction of mutual separation of the respective female contact bumps 43, the female contact bumps 43 are pushed apart slightly when they make contact with the male contact bump 23 providing a wiping action with the male contact bumps 23 whereby reliable electrical connection is obtained.

A coating of foreign matter is often formed on the surface of the contact parts of the contact bumps 23 and 43. When a very small amount of foreign matter adheres to the surface, it is removed by the aforementioned wiping action and good contact can be obtained, but when large amounts of foreign matter adhere, there is a risk of defective contact. Consequently, as shown in FIG. 12(A), one may consider providing a plurality (for example, two sets) of male-female contact bumps for each one of the conductive paths to improve the reliability of connection.

Figure 12:
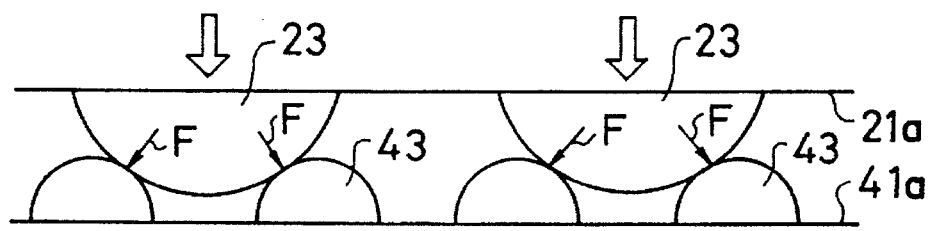
FIGS. 12(A) and 12(B) are diagrammatic views showing the contact forces arising in adjacent groups of mating male and female contact bumps and the resolution of those forces into their components, respectively.
Figure 12:
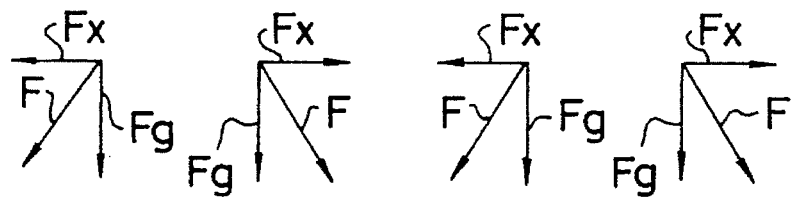

When a plurality of sets of male-female contact bumps are provided as shown in FIG. 12 (A), the pushing force which acts on the contact parts of the two types of bumps is as shown in FIG. 12(B) where the horizontal components Fx of the applied pressures F which act on the contact parts of adjacent bumps of different female sets tend to cancel each other, thereby reducing the wiping action. Consequently, it is preferable to space the adjacent sets of female bumps sufficiently far apart to maintain both the advantage of contact reliability by having a plurality of contact sets connecting to each conductive path, while maintaining an adequate wiping action.

In alternative approaches the contact bumps can also be elongate as described below.

Figure 13:
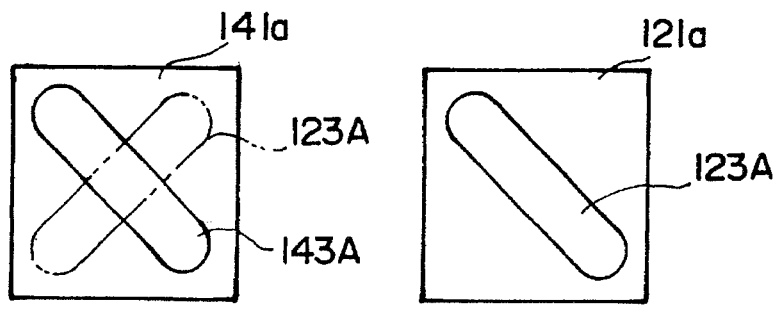
FIG. 13 is a plan view of complementary contact bumps of a sixth embodiment of butt joint connector according to the invention.

As shown in FIG. 13, the first and second complementary contact bumps 123A and 143A are elongate and extend in transverse or diagonal directions on the insulating film layers 121a and 141a, respectively. When the male and female connector members 1 and 3 are connected together, the first bump 123A crosses the second bump 143A perpendicularly as shown by the broken line in the drawing. Consequently, even if the two bumps are not in precise alignment they come into firm and reliable connecting engagement.

Figure 14:
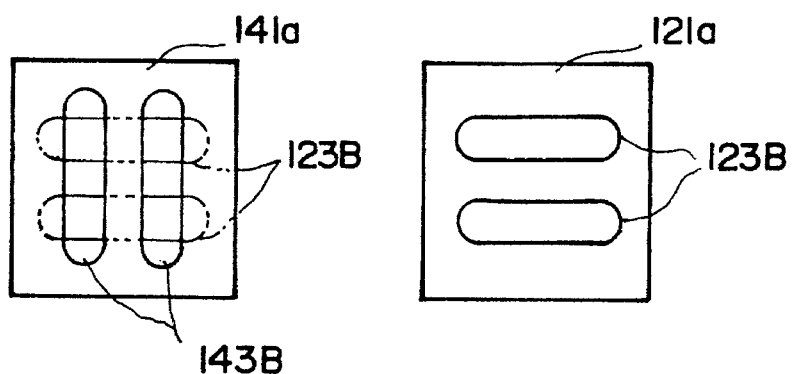
FIG. 14 is a plan view of complementary contact bumps of a seventh embodiment of butt joint connector according to the invention.
Figure 15:
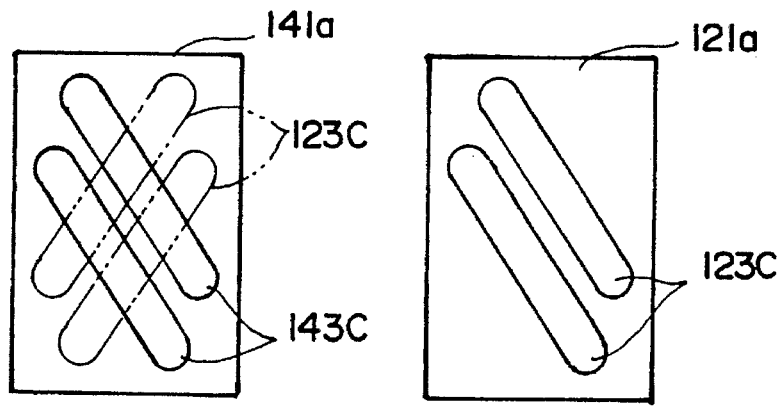
FIG. 15 is a plan view of complementary contact bumps of a an eighth embodiment of butt joint connector according to the invention.
Figure 16:
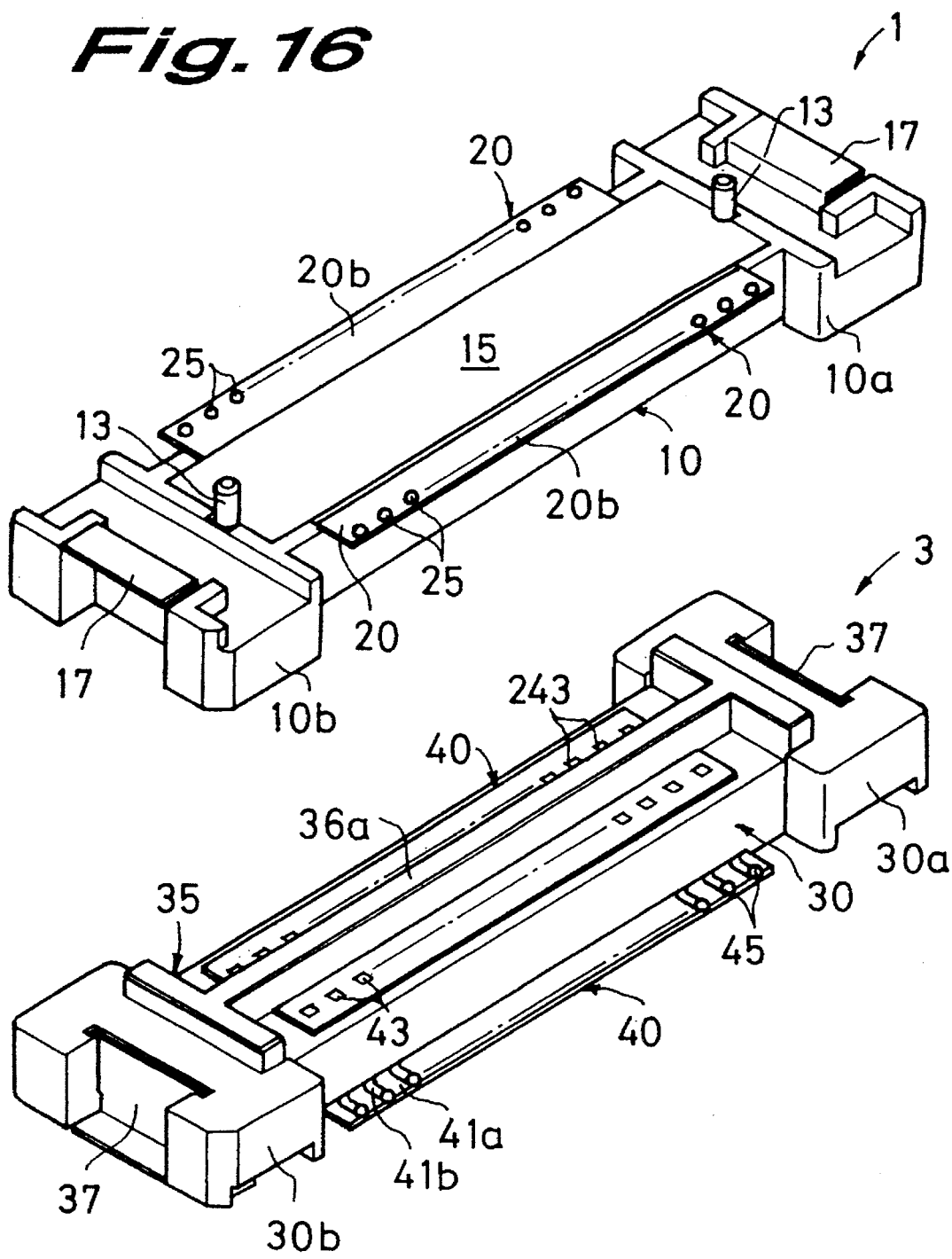
FIG. 16 is a perspective view showing complementary connector members of an ninth embodiment of butt joint connector assembly according to the invention, aligned for mating engagement.
Figure 17:
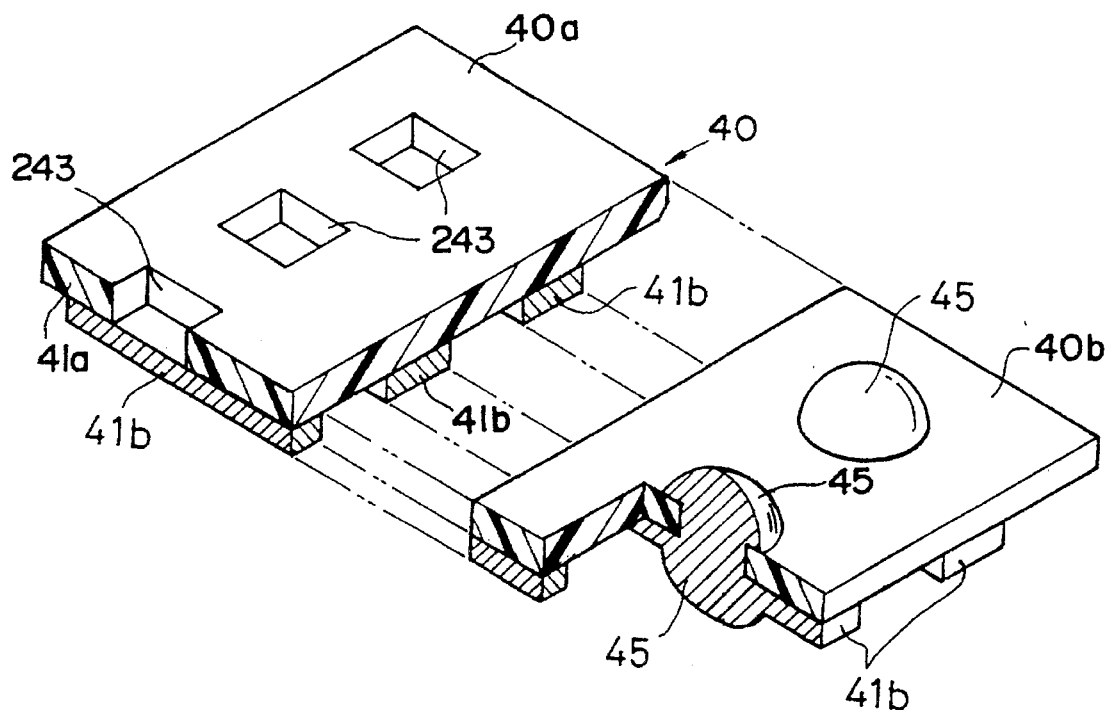
FIG. 17 is a perspective view showing a female type of film circuit contact member of the butt joint connector assembly of FIG. 16.
Figure 18:
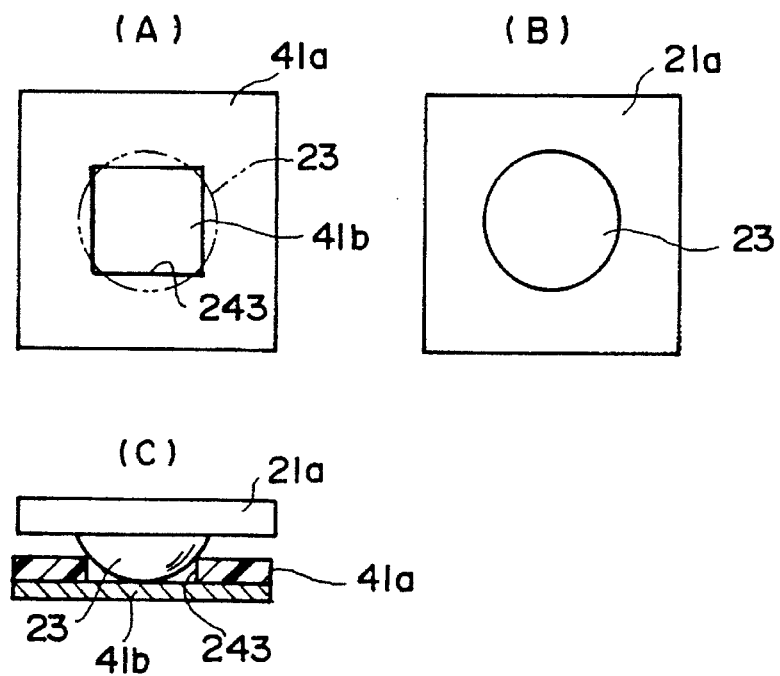
FIG. 18 is a plan view of the male and female contact bumps, and an elevational view of the male and female contact bumps in mating engagement, of male and female types of film circuit contact member of the butt joint connector of FIG. 16.
Figure 19:
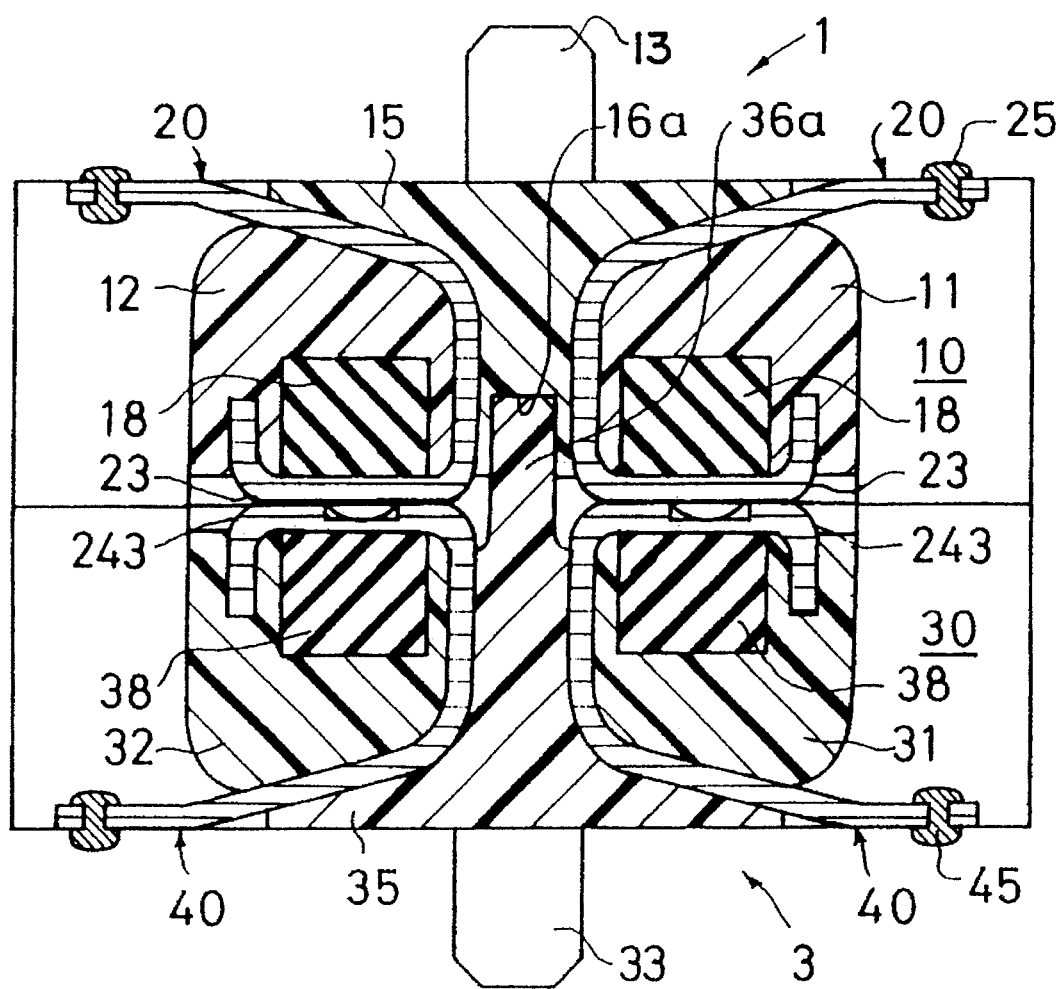
FIG. 19 is a cross-sectional view corresponding to that taken along line XIX—XIX of FIG. 16 but with the connector assemblies in mating engagement.

As shown in FIG. 14, it is also acceptable to form a pair of elongate first bumps 123B which extend in parallel, horizontally, and a pair of elongated second bumps 143B which extend in parallel, vertically. Furthermore, as shown in FIG. 15, it is also acceptable to form pairs of elongate, parallel, sets of first and second bumps 123C and 143C which extend diagonally. In both cases, contact positions are shown by the broken lines in FIG. 14 and FIG. 15.

In the examples shown in FIG. 13 to FIG. 15, as the shape of the first bumps and the second bumps are identical (or symmetrical), the film circuit contact member members can be interchangeable enabling the number of different parts to be reduced, and a reduction in manufacturing costs.

In the embodiment shown in FIGS. 16–19, the same reference numbers have been used to identify parts similar to those of the first embodiment, the only difference being that the insulating film layer of the female film circuit contact member is formed with through apertures forming square recesses overlying respective conductive paths, instead of female contact bumps. Edges of the apertures engage any slightly misaligned male contact bumps to provide a centering action assuring that the contact bumps are fully received in the respective apertures in engagement with the conductive paths. However, as the matching or complementary contact parts are brought into contact merely by being pushed together into normal abutment, they do not rub against each other, and there is no danger of abrasion of the contact parts.

Figure 20:
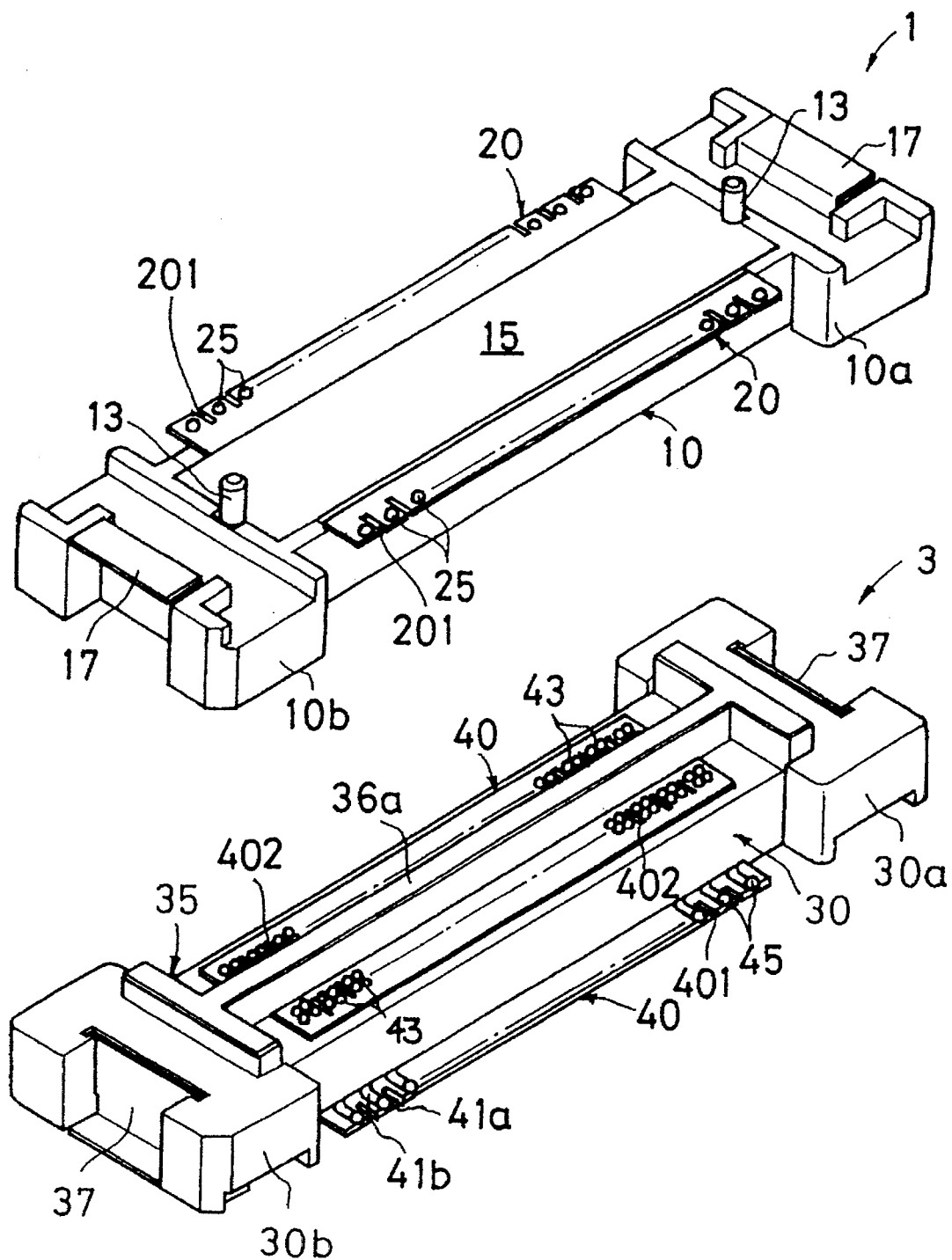
FIG. 20 is a perspective view showing complementary connector members of a tenth embodiment of butt joint connector assembly according to the invention, aligned for mating engagement.
Figure 21:
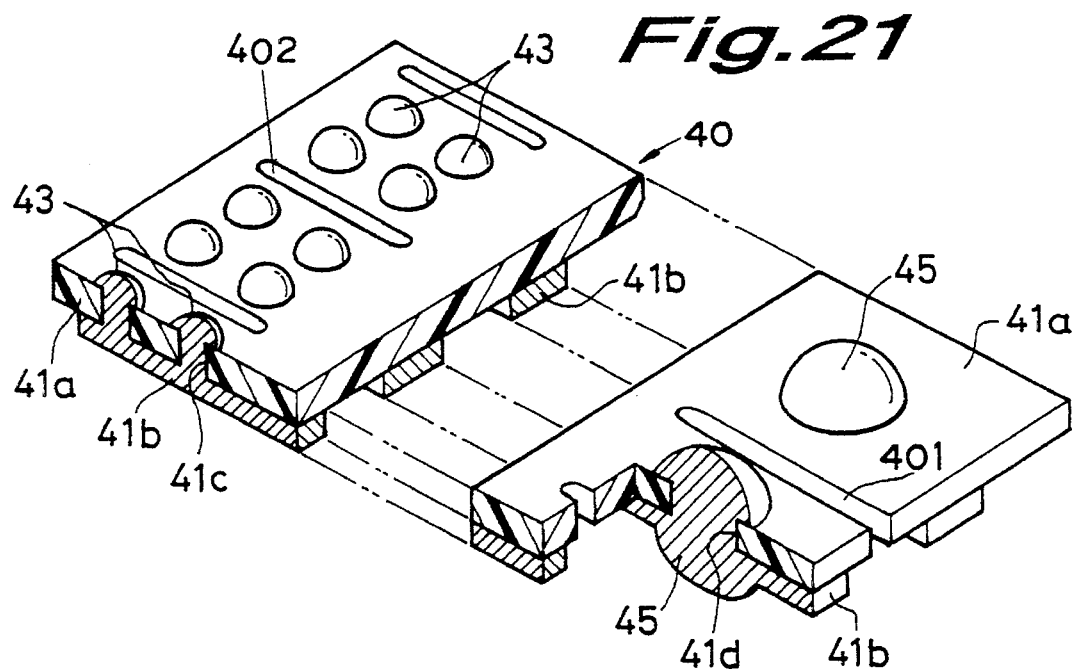
FIG. 21 is a perspective view showing a female type of film circuit contact member of the butt joint connector assembly of FIG. 20; and, FIG. 22 is a plan view of a film circuit contact member according to an eleventh embodiment.
Figure 22:
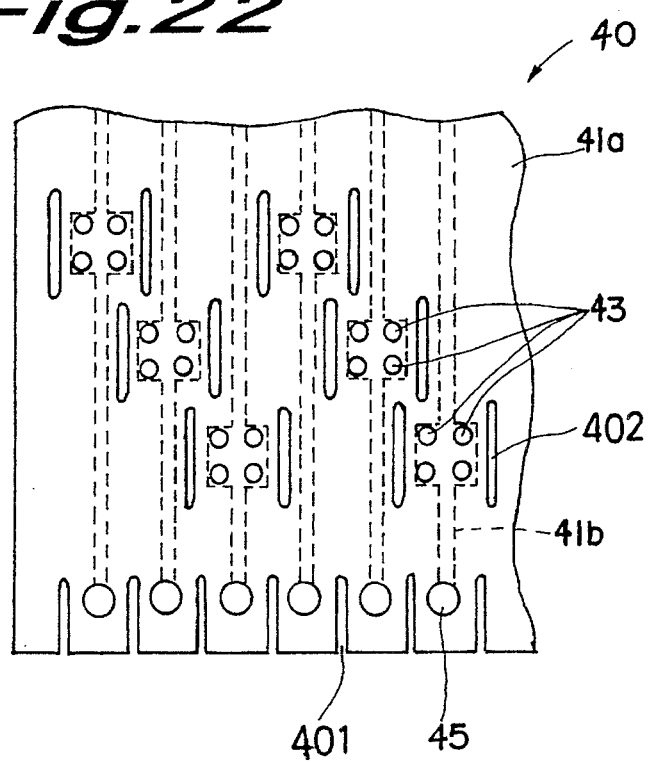

In the embodiments shown in FIGS. 20–22, the same reference numbers have been used to identify parts similar to those of the first embodiment. In these embodiments, stress relieving and isolating slits 402 are formed between adjacent sets of four, in-line, hemispherical contact bumps 43 forming the female configuration or, when the sets of contact bumps are staggered, as shown in FIG. 22, and the center-line spacing between adjacent contact sets is reduced, between each set and adjacent conductive paths 41b. In addition, slits 401 are formed between adjacent soldering bumps 45 at a board connecting edge portion of the film circuit contact member.

Thus, the invention provide the advantages of obviating risk of abrasion of the contact parts as they are only brought into engagement substantially only during mating contact, enabling a long life with many cycles of connection and disconnection while the receipt of the male bump between a plurality of female bumps enables a firm reliable connection with a desirable small wiping action and a self centering action.

Furthermore, where the complementary contact bumps are elongate and extend transversely, significant tolerances resulting in misalignment can be accommodated while the complementary contact bumps can have identical form so that only a single type of film circuit contact member need be manufactured reducing the number of components required and therefore inventory, tooling and manufacturing costs.

We claim:

1. A butt joint connector assembly having, male and female connector members comprising:

male and female flexible film circuit contact members, respectively, each comprising a flexible insulating film having a series of lead forming conductive paths extending thereacross from a contact portion;

each contact portion comprising a series of contact bumps of conductive material upstanding from a mating face of the film and connected to the conductive paths, the series of contact bumps of the female film circuit contact member being arranged in sets of pluralities of bumps with the contact bumps of each set being located in closely spaced apart relation to form a female contact bump configuration connected to a respective conductive path and the series of contact bumps of the male film circuit contact member being arranged as single bumps located at a pitch corresponding to a pitch of the sets of contact bumps forming the female configuration and each forming a male contact bump configuration;

first and second film circuit contact member supporting housings, respectively, having respective mating faces;

means supporting the respective film circuits on respective housings with the respective contact portions extending across respective mating faces substantially perpendicular to a mating direction and with the respective contact bumps outstanding therefrom in the mating direction; and connector guiding means for guiding the connector members into mating engagement with mating contact portions of respective film circuit contact members extending in face-to-face relation so that contact bumps of the male configuration become interposed between and in contact with adjacent portions of respective contact bumps of the respective sets of contact bumps of the female configuration to effect reliable electrical connection between respective conductive paths of the complementary connectors.

2. A butt joint connector assembly according to claim 1 in which the contact bumps of each set are four in number and are arranged to form a square ring.

3. A butt joint connector assembly according to claim 1 in which the contact bumps of each set are three in number and are arranged to form a triangular ring.

4. A butt joint connector assembly according to claim 1 in which resiliently compressible biasing means are mounted on at least one housing member adjacent the mating face underlying the mating contact portion of the respective film circuit contact member.

5. A butt joint connector assembly according to claim 2 in which the male contact bump is elongate so as to bridge completely across the ring of the female set of bumps in a longitudinal direction.

6. A butt joint connector assembly according to claim 5 in which the male contact bump is sufficiently long to extend beyond the ring of the set of bumps in the longitudinal direction and sufficiently wide to extend beyond centers of all the contact bumps of the set in the lateral direction.

7. A butt joint connector assembly according to claim 1 in which each set comprises two elongate contact bumps located in parallel relation.

8. A butt joint connector assembly according to claim 1 in which slots are formed in the insulating film between adjacent sets of contact bumps to isolate them from each other.

9. A butt joint connector assembly according to claim 1 in which the sets of contact bumps are in staggered relation along respective conductive paths and isolating slots are formed in the insulating film between respective sets of contact bumps and adjacent conductive paths of adjacent sets.

10. A butt joint connector assembly according to claim 1 in which each film circuit contact member has a circuit board engaging portion spaced apart from the contact portion and to which respective conductive paths extend and solder bumps extending through apertures through the insulating film and respective conductive paths to upstand from respective opposite surfaces of the film circuit contact member.

11. A butt joint connector assembly according to claim 1 in which isolation slots are formed between adjacent solder bumps.

* * * * *